United States Patent [19]

Schor

[11] 3,753,168

[45] Aug. 14, 1973

[54] LOW PASS FILTER NETWORK

[75] Inventor: Ferdinand William Schor, Altadena, Calif.

[73] Assignee: AMP Incorporated, Harrisburg, Pa.

[22] Filed: Mar. 9, 1972

[21] Appl. No.: 233,121

[52] U.S. Cl. .................................. 333/70 S, 333/79

[51] Int. Cl. ............................................ H03h 7/04

[58] Field of Search .................. 333/79, 70 R, 70 S, 333/76

[56] References Cited

UNITED STATES PATENTS

| | | | |
|---|---|---|---|
| 3,548,347 | 12/1970 | Miller et al. | 333/79 |
| 3,200,355 | 8/1965 | Dahlen | 333/79 |
| 3,035,237 | 5/1962 | Schilicke | 333/79 |
| 2,918,633 | 12/1959 | Schenker et al. | 333/70 S |
| 3,456,215 | 7/1969 | Denes | 333/79 |
| 3,546,638 | 12/1970 | Park | 333/79 |
| 3,613,033 | 12/1971 | Denes | 333/79 |
| 3,638,144 | 1/1972 | Denes | 333/79 |

OTHER PUBLICATIONS

"Interference Decoupling System", Chapman in IBM Technical Disclosure Bulletin Vol. 3 No. 4 September, 1960; p. 24.

*Primary Examiner*—Rudolph V. Rolinec
*Assistant Examiner*—Marvin Nussbaum
*Attorney*—William J. Keating et al.

[57] ABSTRACT

An electrical filter having a first and second terminals extending from opposite ends of a conductive case and a filter network housed within the conductive case. The filter network comprises at least one capacitor connected between the case and the first terminal and an inductive component connected between the first terminal and the second terminal. The filter network further comprises a tubular high frequency filter carried by and connected between the second terminal and the conductive case. The capacitor may extend axially along or transversely across the conductive case and the inductive component may be provided by an inductor or a ferrite bead associated with a terminal member.

13 Claims, 5 Drawing Figures

LOW PASS FILTER NETWORK

BACKGROUND OF THE INVENTION

This invention relates to electromagnetic interference (EMI) feed-thru filters. Filters of this type are utilized where a lead enters a compartment, and it is desirable to shield components within the compartment from interference which may enter through the lead.

More specifically, this invention relates to filters for use in the foregoing applications wherein the filter network comprises a high frequency low pass filter component in combination with lumped components of a filter unit. A filter of this type is disclosed in copending application Ser. No. 166,899, filed July 28, 1971, now abandoned, which is assigned to the assignee of this invention. The aforesaid application describes a filter wherein the lumped L-C components comprise a discoidal capacitor in combination with a toroidal inductor. A tubular lossy ceramic filter component is utilized to reduce high frequency resonances which reduce filtering effectiveness. This filter combination has excellent high frequency characteristics. However, the use of a discoidal capacitor increases the manufacturing cost considerably.

SUMMARY OF THE INVENTION

In accordance with one aspect of this invention, a filter is provided comprising a first terminal and a second terminal extending from opposite ends of a conductive case and a filter network. The filter network includes relatively low cost chip capacitor means which are located within the conductive case and connected between the case and the first terminal element. An inductive component of the filter network is also enclosed within the case so as to provide an inductance between the first and second terminals. A high frequency filter component is also located within the case and connected between the case and the second terminal.

In accordance with another aspect of the invention, the chip capacitor means may extend axially along or transversely across the conductive case.

In accordance with still another aspect of the invention, the inductive component may comprise a coil on a ferrite core connected in series with the chip capacitor means. In the alternative, the inductive component may comprise a ferrite bead encircling a terminal member extending from the first terminal to the second terminal.

BRIEF DESCRIPTION OF THE DRAWINGS

These and other aspects of the invention will be better understood with reference to the specification and drawings in which.

DETAILED DESCRIPTION OF A PREFERRED EMBODIMENT

Figures 1, 2, 3:
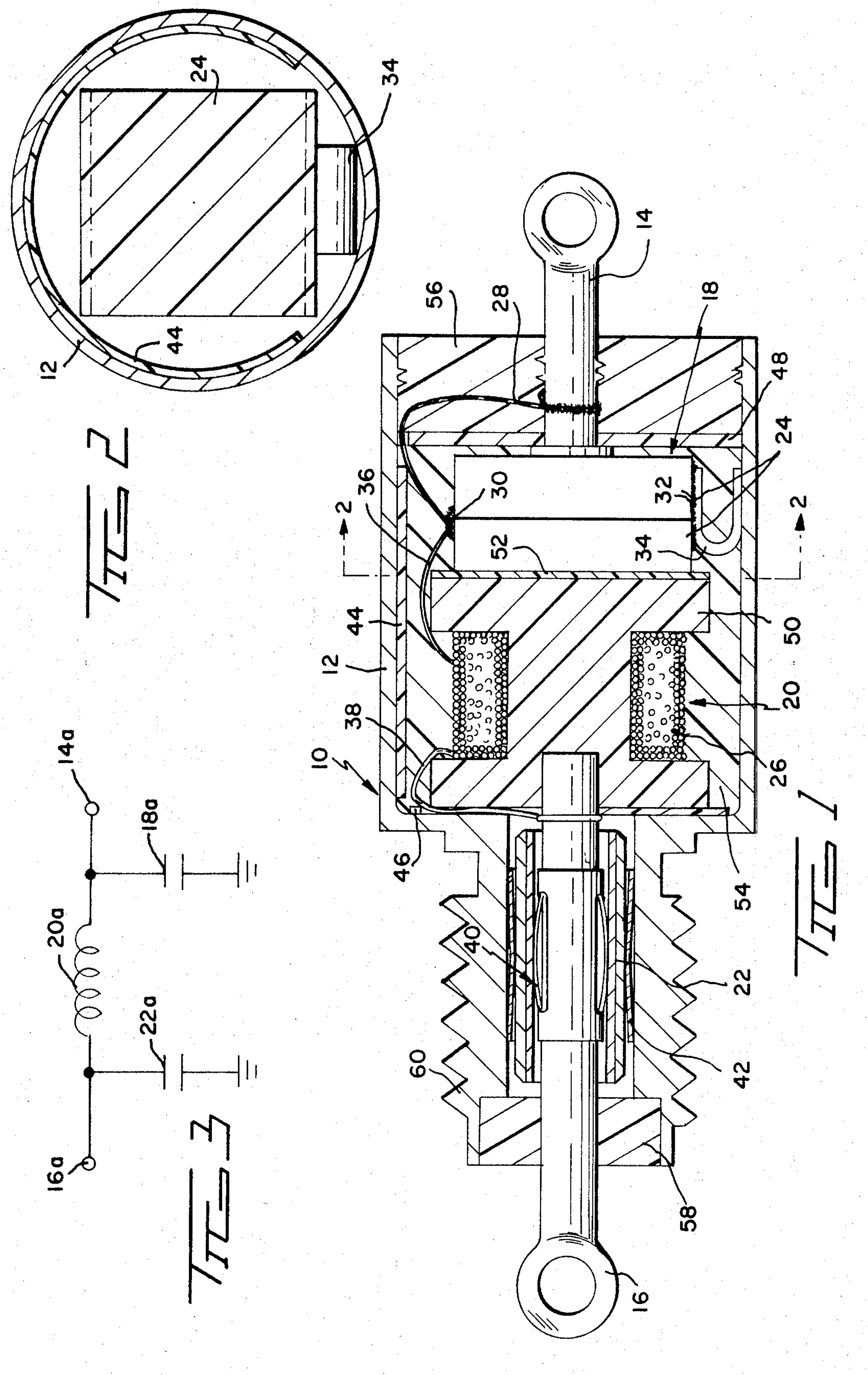
FIG. 1 is an axially sectioned view of a filter embodying this invention.
FIG. 2 is a sectional view of the filter shown in FIG. 1 taken along section line 2—2.
FIG. 3 is a schematic circuit diagram for the filter network of the filter shown in FIG. 1.

Referring to FIGS. 1 and 2, a feed-thru filter 10 having a filter network comprises a conductive case 12 having a first terminal 14 and a second terminal 16 extending from opposite ends of the case 12. The filter network contained within the conductive case 12 comprises chip capacitor means 18, an inductive component 20 and a high frequency, tubular ceramic and ferrite filter 22.

The chip capacitor means 18 which comprises one or a plurality of back-to-back chip capacitors extending transversely across the case 12 provides capacitance 18a of the equivalent filter circuit shown in FIG. 2. The inductive component 20 of the filter network, which comprises a coil wound on a core of magnetic material such as ferrite or an air core and having a plurality of turns provides the inductance 20a of the equivalent circuit. The high frequency filter 22 may comprise a cylindrical ceramic capacitor extending over and along a ferrite sleeve to provide the capacitance *22a*. (The resistive losses of the ferrite are not shown.) A suitable high frequency filter 22 may comprise a ferrite substrate carrying a deposit of barium titanate. Various details and aspects of such a filter are described in copending application Ser. No. 88,042, filed Nov. 9, 1970, which is incorporated herein by reference. Although the high frequency insertion loss of a chip capacitor is inferior to that of a discoidal capacitor, the high frequency insertion loss improves with the inductance *20a* provided by the coil 26 and the added high frequency insertion loss provided by high frequency filter 22.

As shown in FIG. 3, the capacitance *18a* is connected between the terminal *14a* and ground and the high frequency filter designated by capacitance *22a* is connected between the terminal *16a* and ground. The inductance *20a* is connected between the terminals *14a* and *16a*. This is accomplished within the feed-thru filter 10 by the use of a conductive element in the form of a wire 28 which is soldered or otherwise conductively affixed to the terminal 14 and also soldered or otherwise conductively affixed to a junction 30 between the chip capacitors 24. Another soldered junction 32 of the capacitors 24 is connected to the conductive case 12 through a conductive grounding spring 34. The inductive component 20 is further connected between the terminals 14 and 16 by a conductive element in the form of a wire 36 which extends from the junction 30 to one terminal of the coil 26 and a conductive element or wire 38 which extends from the other terminal of the coil 26 to a second terminal 16 where it is soldered or otherwise conductively affixed thereto. In order to connect the high frequency tubular ceramic filter 22 between ground represented by the conductive case 12 and the terminal 16, an inner barrel spring 40 and an outer barrel spring 42 are provided.

In order to assure that the conductive elements 28, 36 and 38 are insulated from the conductive case, a case insulator 44 is utilized which extends approximately 270° around the interior of the case 12. In addition, a bottom insulating washer 46 and a top insulating washer 48 are utilized. In order to electrically separate the chip capacitors 24 from the ferrite bobbin 50, a bobbin spacer 52 is provided.

Epoxy 54 is utilized to encapsulate the components of the filter network in the case 12. Epoxy plugs 56 and 58 are utilized at the ends of the case 12. Note that the bottom portion 60 of the case 12 is threaded to provide a means of conductively attaching the filter to one wall of a metal housing.

Figures 4, 5:
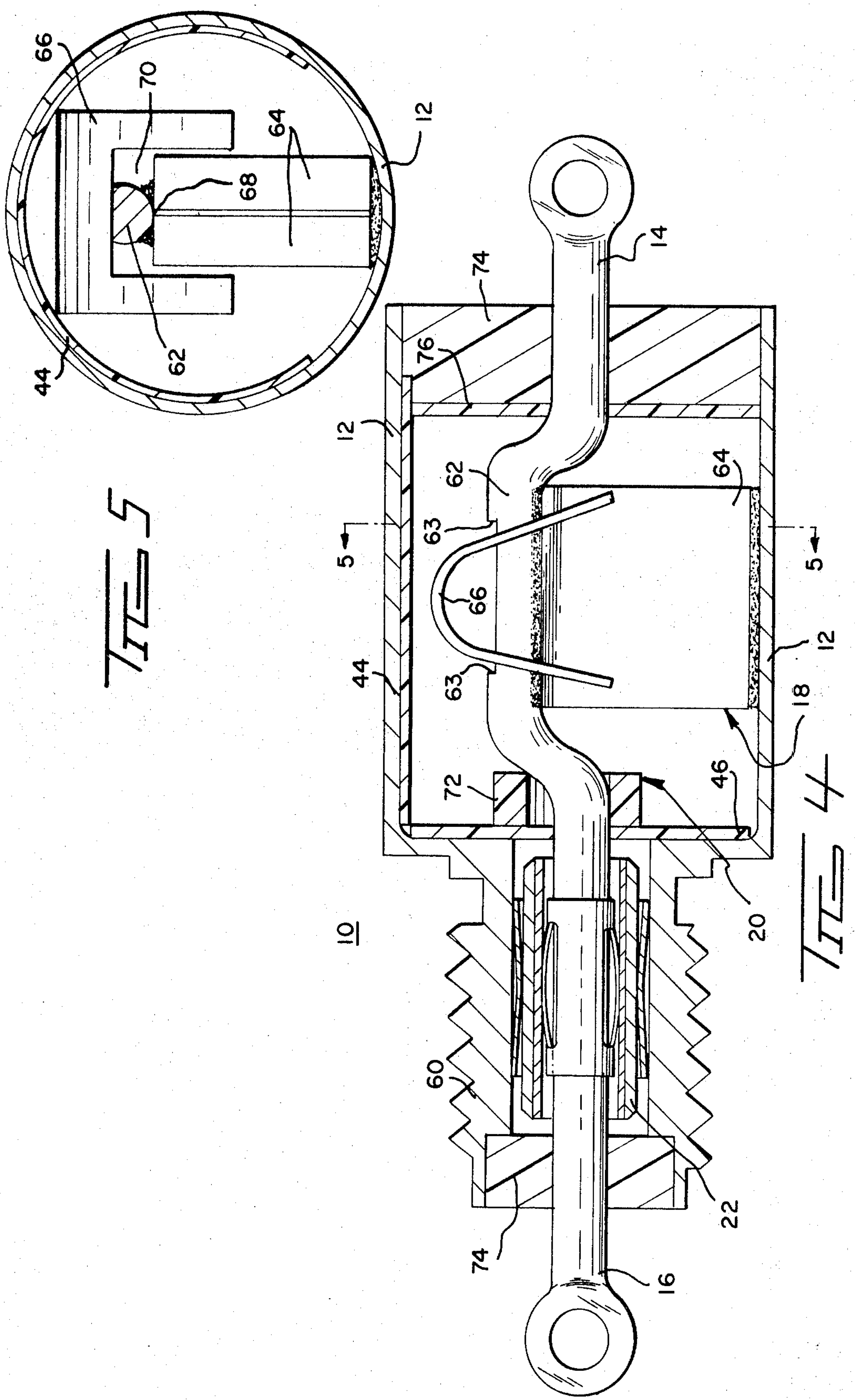
FIG. 4 is an axially sectioned view of another filter embodying the invention.
FIG. 5 is a sectional view of the filter of FIG. 4 taken along section line 5—5.

The chip capacitors 24 are commercially available items. In general, capacitors of a size permitting mounting inside the case in the position shown in FIG. 1 or FIG. 4 are well suited for use in the feed-thru filter of this invention. The coil 26, for example, can be made from a plurality of turns of wire and may be wound on a suitable ferrite core 50 so as to provide a coil capable of being mounted as shown in FIG. 1.

Another filter embodying the invention will now be described with reference to FIGS. 4 and 5. Where the elements of the filter in FIGS. 4 and 5 are substantially identical to the elements of the filter of FIGS. 1 and 2, identical reference characters will be utilized. It will be seen that the filter of FIGS. 4 and 5 comprises a chip capacitor means 18 which extends axially along the conductive case 12 rather than transversely across the case.

This is accomplished by providing an integral terminal element for both terminals 14 and 16 where the element has a recessed intermediate portion 62 which receives the axially extending single or pair of capacitors 64 which may be of the chip type. The conductive case 12 contacts one side of the chip capacitors 64. On the other side, the chip capacitors 64 are held in contact with the recessed portion of the integral conductive element by an arched spring 66 which is retained within a notch 63 in the terminal element 62. As best shown in FIG. 5, the arch of spring 66 bears against the case insulator 44 to hold one side of the chip capacitors against the case 12. The other side of the chip capacitors is soldered to the terminal element 62. As also best shown in FIG. 5, the chip capacitors 64 are located in notches 70 in the arched spring 66. This positioning maintains contact between the chip capacitors and the terminal element 62 should the solder soften due to excessive heat applied to the terminal 14.

It will also be seen that the inductive component 20 which is provided by a ferrite bead 72 is connected between terminals 14 and 16. This is accomplished by a ferrite bead 72 which encircles the intermediate portion of the conductive terminal element 62.

In order to seal the filter 10, the ends of the case 12 are filled with epoxy 74. An insulating washer 76 is provided on the inside surface of the epoxy 74 adjacent the chip capacitors 64.

Although two specific embodiments of the invention have been shown and described, it will be understood that the appended claims cover all modifications which fall within the scope of the invention.

What is claimed is:

1. A filter comprising:
a tubular conductive case;
a first terminal and a second terminal extending from opposite ends of said case and insulated therefrom;
a solid chip capacitor means located within said conductive case;
first means electrically connecting the first terminal element directly to the chip at one location thereon;
second means electrically connecting the case directly to the chip at a second location thereon spaced from the first location, to capacitively couple the case and said first terminal;
a high frequency filter means connected between said case and said second terminal element; and
an inductive means located within said case and connected between said first terminal and said second terminal.

2. The filter of claim 1 wherein said capacitor means includes at least one chip capacitor extending transversely across said conductive case.

3. The filter of claim 1 wherein the second means includes a grounding spring connecting said conductive case to said chip capacitor.

4. The filter of claim 2 wherein said inductive means comprises a coil wound on a ferrite bobbin.

5. The filter of claim 1 wherein said chip capacitor means includes at least one chip capacitor extending axially along said conductive case.

6. The filter of claim 5 further comprising a conductive element extending through said conductive case, one end of said conductive element forming said first terminal, the other end of said conductive element forming said second terminal, said first means conductively connecting an intermediate portion of said conductive element to said chip capacitor means.

7. A filter comprising:
a conductive case;
a first terminal and a second terminal extending from opposite ends of said case;
a chip capacitor means located within said conductive case and connected between said case and said first terminal element;
a high frequency filter means connected between said case and said second terminal element; and
an inductive means located within said case and connected between said first terminal and said second terminal,
wherein said chip capacitor means includes at least one chip capacitor extending axially within said conductive case, further comprising a conductive element extending through said conductive case, one end of said conductive element forming said second terminal, and an intermediate portion of said conductive element being electrically connected to said chip capacitor,
wherein said chip capacitor means comprises a plurality of capacitors and said filter further comprises an arched spring member bearing on and insulated from said case for holding said capacitors in electrical contact with said filter case, said intermediate portion forms a recess receiving said capacitors, said intermediate portion including a notch at said recess to retain said spring member.

8. The filter of claim 7 wherein said chip capacitor means comprises a plurality of capacitors and said filter further comprises an arched spring member bearing on and insulated from said case for holding said capacitors in position to maintain electrical contact with said filter case.

9. The filter of claim 6 wherein said inductive element comprises a ferrite bead encircling said conductive element.

10. The filter of claim 1 wherein said chip capacitor means comprises a plurality of chip capacitors.

11. The filter of claim 1 wherein said high frequency filter comprises a tubular filter encircling said second terminal.

12. The filter of claim 11 wherein said tubular filter comprises a ferrite sleeve and a tubular ceramic capacitor extending over and along said sleeve.

13. The filter of claim 1 wherein the terminals are insulated from one another.

* * * * *